(12) United States Patent
Kuperman et al.

(10) Patent No.: US 10,591,358 B2
(45) Date of Patent: Mar. 17, 2020

(54) COMPACT INFRARED CAMERA FOR AUTOMOTIVE SAFETY AND DRIVING SYSTEMS

(71) Applicant: Adasky, Ltd., Yokneam Illit (IL)

(72) Inventors: Vitaly Kuperman, Maalot (IL); Nir Brandwine, Karmiel (IL)

(73) Assignee: Adasky, Ltd., Yokneam Illit (IL)

( * ) Notice: Subject to any disclaimer, the term of this patent is extended or adjusted under 35 U.S.C. 154(b) by 0 days.

(21) Appl. No.: 16/236,884

(22) Filed: Dec. 31, 2018

(65) Prior Publication Data

US 2019/0186998 A1 Jun. 20, 2019

Related U.S. Application Data

(63) Continuation of application No. 15/841,995, filed on Dec. 14, 2017, now Pat. No. 10,175,112.

(51) Int. Cl.
| | |
|---|---|
| *G01J 5/08* | (2006.01) |
| *H04N 5/33* | (2006.01) |
| *G01J 5/02* | (2006.01) |
| *H01L 27/146* | (2006.01) |
| *H04N 5/225* | (2006.01) |

(52) U.S. Cl.
CPC ............. *G01J 5/0215* (2013.01); *G01J 5/08* (2013.01); *H01L 27/14601* (2013.01); *H04N 5/33* (2013.01); *H04N 5/2252* (2013.01)

(58) Field of Classification Search
CPC ........ H04N 5/33; H04N 5/332; H04N 5/2254; H04N 5/2252; G01J 5/0834; G01J 5/0859; G01J 5/089; G01J 5/0215; G01J 5/08; H01L 27/14621; H01L 27/14627; H01L 27/14629; H01L 27/14601
See application file for complete search history.

(56) References Cited

U.S. PATENT DOCUMENTS

| | | | |
|---|---|---|---|
| 5,173,443 | A | 12/1992 | Biricik et al. |
| 5,414,439 | A | 5/1995 | Groves et al. |

(Continued)

FOREIGN PATENT DOCUMENTS

| | | |
|---|---|---|
| CN | 204031303 U | 12/2014 |
| CN | 205175557 U | 4/2016 |

(Continued)

OTHER PUBLICATIONS

Preliminary Rejection for Korean Patent Application No. 10-2018-0161769 dated Apr. 16, 2019, KIPO, Korea.
Germanium window, ø 25.4 mm x 3.0 mm, Del Mar Photonics, San Diego, CA., URL: http://www.dmphotonics.com/Germanium-Optics/Germanium%20Windows%20and%20Lenses%20for%20Thermography.htm.

(Continued)

*Primary Examiner* — David P Porta
*Assistant Examiner* — Fani Boosalis
(74) *Attorney, Agent, or Firm* — M&B IP Analysts, LLC

(57) ABSTRACT

A camera apparatus. The camera apparatus includes a housing having a front end and a back end; a lens, wherein the lens is disposed in the front end of the housing; and a thermal core, wherein the thermal core is disposed between the lens and the back end of the housing, the thermal core further comprising: at least one substrate; at least one thermally conductive member configured to remove heat from the thermal core; and an infrared imager affixed to one of the at least one substrate, the infrared imager configured to capture an infrared video stream.

11 Claims, 3 Drawing Sheets

(56) References Cited

U.S. PATENT DOCUMENTS

| | | |
|---|---|---|
| 5,613,968 A | 3/1997 | Lin |
| 6,559,447 B2 | 5/2003 | Wood |
| 6,759,949 B2* | 7/2004 | Miyahara ............... G06T 5/008 340/435 |
| 7,402,802 B1 | 7/2008 | Terre et al. |
| 7,862,593 B2 | 1/2011 | Clement et al. |
| 7,965,336 B2 | 6/2011 | Bingle et al. |
| 8,471,911 B2 | 6/2013 | Kallhammer et al. |
| 8,581,982 B1 | 11/2013 | Haley et al. |
| 8,743,207 B2 | 6/2014 | Boulanger et al. |
| 8,759,717 B2 | 6/2014 | Chamberlain |
| 8,791,878 B2 | 7/2014 | Yamazaki et al. |
| 9,061,632 B2 | 6/2015 | Toyofuku |
| 9,090,205 B2 | 7/2015 | Nagaoka et al. |
| 9,377,363 B2 | 6/2016 | Boulanger et al. |
| 9,555,736 B2 | 1/2017 | Solar et al. |
| 2002/0162963 A1 | 11/2002 | Lannestedt et al. |
| 2003/0146199 A1 | 8/2003 | Sol et al. |
| 2007/0216768 A1 | 9/2007 | Smith et al. |
| 2008/0110254 A1 | 5/2008 | Zhao et al. |
| 2008/0203079 A1 | 8/2008 | Veerasamy et al. |
| 2009/0062859 A1 | 3/2009 | Mahoney et al. |
| 2010/0237055 A1 | 9/2010 | Rousseau et al. |
| 2012/0209332 A1 | 8/2012 | Janowski |
| 2013/0062228 A1 | 3/2013 | Danilov |
| 2014/0027433 A1 | 1/2014 | Lisinski et al. |
| 2014/0098238 A1 | 4/2014 | Boulanger et al. |
| 2016/0075211 A1 | 3/2016 | Kim |
| 2016/0156880 A1* | 6/2016 | Teich .................... H04N 5/225 348/82 |

FOREIGN PATENT DOCUMENTS

| | | |
|---|---|---|
| JP | 2004104632 A | 4/2004 |
| JP | 2014032337 A | 2/2014 |
| WO | 2004047421 A2 | 6/2004 |
| WO | 2014106276 A2 | 7/2014 |

OTHER PUBLICATIONS

Germanium Windows with AR and DLC Coatings, Del Mar Photonics, Nov. 2012, URL: https://www.youtube.com/watch?v=Chg9SWcJNLw.

Germanium Windows/Substrates, Electro Optical Components, Inc., 2017, URL: http://www.eoc-inc.com/germanium_windows.htm.

The European Search Report for EP Application No. 18212592.2 dated Apr. 9, 2019, EPO, Munich, Germany.

International Search Report and Written Opinion of International Searching Authority for PCT/US2018/067722, ISA/RU, Moscow, Russia, dated May 7, 2019.

The First Chinese Office Action for Chinese Patent Application No. 2018115256038, Dec. 16, 2019, CNIPA, China.

* cited by examiner

COMPACT INFRARED CAMERA FOR AUTOMOTIVE SAFETY AND DRIVING SYSTEMS

CROSS-REFERENCE TO RELATED APPLICATIONS

This application is a continuation of U.S. patent application Ser. No. 15/841,995, filed Dec. 14, 2017, now allowed. The contents of the above mentioned application is hereby incorporated by reference.

TECHNICAL FIELD

The present disclosure relates generally to infrared cameras, and more specifically to compact infrared cameras.

BACKGROUND

As sensor-based technology has improved dramatically in recent years, new uses for sensors have become possible. In particular, cameras have become widely utilized for various applications. For many of these applications, it is desirable to minimize the size and weight of the camera to allow for deployment in tight spaces and to minimize costs of the camera. Additionally, although many cameras utilize moving parts to capture images, it is desirable to avoid use of moving parts where possible to ensure reliability of the camera.

One type of camera that may be utilized in many applications is the thermal infrared camera. Thermal infrared (IR) cameras capture image wavelengths in the range of seven and a half to fourteen micrometers. A typical IR camera uses an infrared sensor (or detector) to detect infrared energy that is guided to the sensor through the camera's lens. IR cameras can be utilized for a variety of imaging applications including, but not limited to, passive motion detection, night vision, thermal mapping, health care, building inspection, surveillance, and the like. Recently, an attempt has been made in the IR industry to integrated IR cameras in advanced driver assistance systems and autonomous vehicle systems.

One type of IR sensor is an uncooled Far-Infrared (FIR) sensor having a small form factor. Such sensors can typically be mass-produced using low-cost technology. In a typical arrangement, an uncooled sensor does not require a cryo-cooler for proper operation, but does require a shutter for frequent calibration. A shutter is a mechanical element placed between the lens and the FIR sensor for alternately blocking and exposing the sensor to infrared wavelengths. Generally, a shutter includes a flat-bladed flag, a sleeve, and an arm that connects the sleeve to the flag. The flag opens and closes at predefined time intervals. Alternatively, the shutter may be operated using an image quality algorithm.

While using a shutter may improve the quality and accuracy of the thermal image captured by a FIR sensor, having a black period of tenths of a second is not acceptable in certain applications. For example, using a shutter-based FIR camera in advanced driver assistance systems and autonomous vehicle systems can pose a high risk, as the camera must frequently shut off for a few hundreds of milliseconds. In addition, shutters include moving parts that wear out over time. This may cause a camera malfunction during driving and shorten the life time of the camera.

The FIR camera designed for advanced driver assistance systems and autonomous vehicle systems should meet additional constraints other than safety. Such constraints include a small form factor, accurate and low latency image processing, and low-power consumption. For vehicle-based uses, it is typically desirable to minimize the form factor of the camera to avoid interference with the driver's view or with vehicle systems, to minimize the manufacturing costs for the camera, to minimize fuel costs, to minimize maintenance required for the camera, to open up new possible locations for camera placement, and for other reasons.

Existing solutions face challenges in reducing form factor of cameras and, in particular, infrared cameras. Although solutions involving reduced form factor infrared cameras exist, such solutions often face other challenges with respect to heat dissipation, image quality, and more. Thus, when the size of the camera is decreased, the performance of the camera typically degrades.

Further, many existing solutions utilize various non-integrated electrical components, thereby requiring multiple sources of power in the form of printed circuit boards and power supply voltages. Accordingly, existing solutions often result in complex and costly manufacturing processes.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

The embodiments disclosed herein include a camera apparatus. The camera apparatus includes a housing having a front end and a back end; a lens, wherein the lens is disposed in the front end of the housing; and a thermal core, wherein the thermal core is disposed between the lens and the back end of the housing, the thermal core further comprising: at least one substrate; at least one thermally conductive member configured to remove heat from the thermal core; and an infrared imager affixed to one of the at least one substrate, the infrared imager configured to capture an infrared video stream.

The embodiments disclosed herein include an advanced driver assistance system, including: a shutterless far-infrared (FIR) camera integrated in a vehicle, wherein the camera is structured to include: a housing having a front end and a back end; a lens disposed in the front end of the housing; and a thermal core disposed between the lens and the back end of the housing, the thermal core further comprising: at least least one substrate; at least one thermally conductive member configured to remove heat from the thermal core; and an infrared imager affixed to one of the at least one substrate, the infrared imager configured to capture an infrared video stream.

The embodiments disclosed herein include a vehicle, including: an autonomous vehicle system; a shutterless far-infrared (FIR) camera integrated the autonomous vehicle system, wherein the camera is structured to include: a housing having a front end and a back end; a lens disposed in the front end of the housing; and a thermal core disposed between the lens and the back end of the housing, the thermal core further comprising: at least one substrate; at least one thermally conductive member configured to remove heat from the thermal core; and an infrared imager affixed to one of the at least one substrate, the infrared imager configured to capture an infrared video stream.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
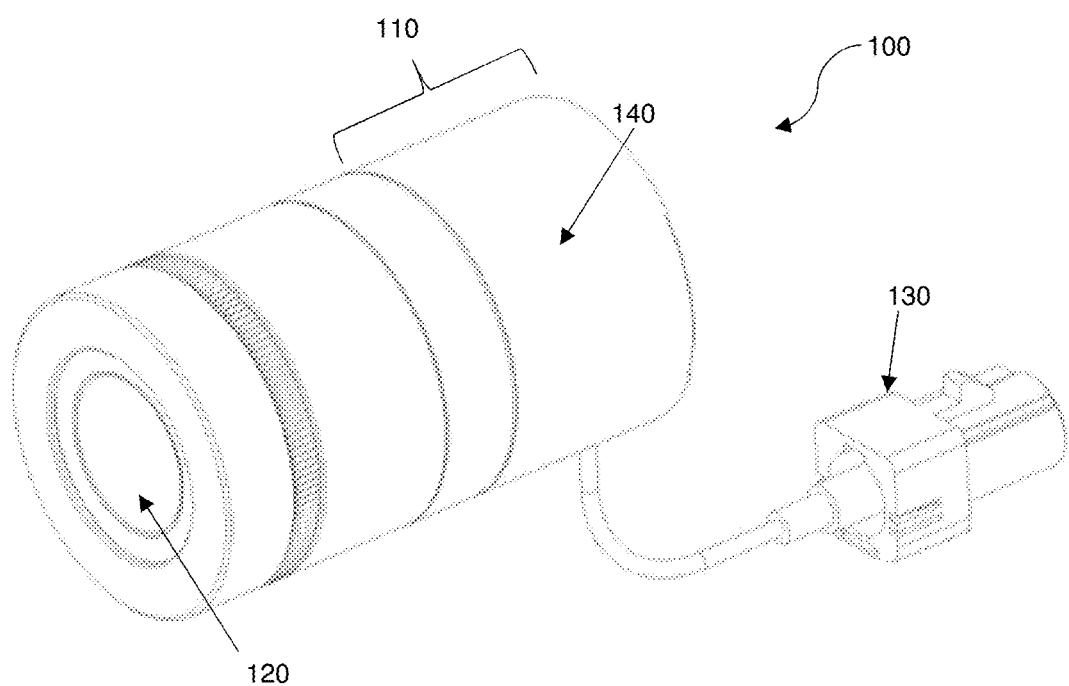
FIG. 1 is an isometric view of a camera apparatus according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts throughout several views.

The various disclosed embodiments include a Far-Infrared (FIR) camera that does not include a shutter or any other moving part that blocks the field of view of the camera during operation. Thus, the FIR camera is a shutter-less camera. In an embodiment, the FIR camera is optimized to operate or be integrated in advanced driver assistance systems and autonomous vehicle and other driving assistance systems.

The FIR camera is realized as a compact infrared camera apparatus. The camera apparatus includes a housing, a thermal core disposed in the housing, and a lens disposed in and affixed to a front end of the housing. The thermal core includes an electrical component coupled to one or more substrates, and an infrared imager affixed to one of the substrates. Each substrate may be, for example, a printed circuit board (PCB). The thermal core may further include thermally conductive members and a thermal connection member configured to divert heat from the substrate to the housing, thereby allowing for removing heat to the environment around the camera apparatus.

Some advantages of the disclosed embodiments include the infrared camera having a small form factor, thereby allowing for deployment in various tight spaces. Additionally, the disclosed embodiments provide a low complexity design as compared to many existing solutions, thereby reducing manufacturing, assembly, and materials costs. Accordingly, the disclosed camera apparatus may be conveniently utilized for various applications and, in particular, autonomous or assisted driving systems integrated into vehicles. For example, the small size form factor of the camera apparatus allows for installation of the apparatus in various locations in a vehicle that would not change the overall appearance of the vehicle. Further, multiple camera apparati may be installed at once without changing the overall appearance of the vehicle.

FIG. 1 shows an isometric view of an infrared camera apparatus 100 according to an embodiment. The camera apparatus 100 includes a thermal core 110 disposed in a housing 140 (thermal core 110 described further herein below with respect to FIGS. 2 and 3), a lens 120. The electrical component may be, but is not limited to, a coaxial cable. In an embodiment, the camera apparatus 100 is a shutterless camera that does not require internal moving parts to capture infrared images.

The thermal core 110 includes components utilized for capturing infrared images such as, but not limited to, a substrate, an infrared imager, thermally conductive members (not shown in FIG. 1), and at least a portion of an electrical component 130. In an embodiment, each of the thermal core 110, the lens 120, and the housing 140 is cylindrical or otherwise has a rounded cross-section, thereby reducing the form factor as compared to, for example square shaped cross-sectional cameras.

The lens 120 is an optical lens configured to collect, focus, or collimate infrared light, or a combination thereof. The infrared light is captured by the imager 210.

The electrical component 130 is configured to provide power to the thermal core 110 and to transfer video to, for example, a video decoder. To this end, the electrical component 130 may be a cable (e.g., a gigabit multimedia serial link cable).

Thermal video streams as output by the camera apparatus 100 can be utilized for the detection of vehicles, pedestrians, animals, two-wheelers, black-ice spots, litter, debris, potholes, gully covers, curbs and so on. In an embodiment, a computer (not shown) may be an onboard vehicle computer or a dedicated computer installed in a vehicle (not shown) and communicatively connected with the camera apparatus 100.

It should be noted that the housing 140 shown in FIG. 1 is merely an example, and that the housing is not limited to the particular structure shown in FIG. 1.

Figure 2:
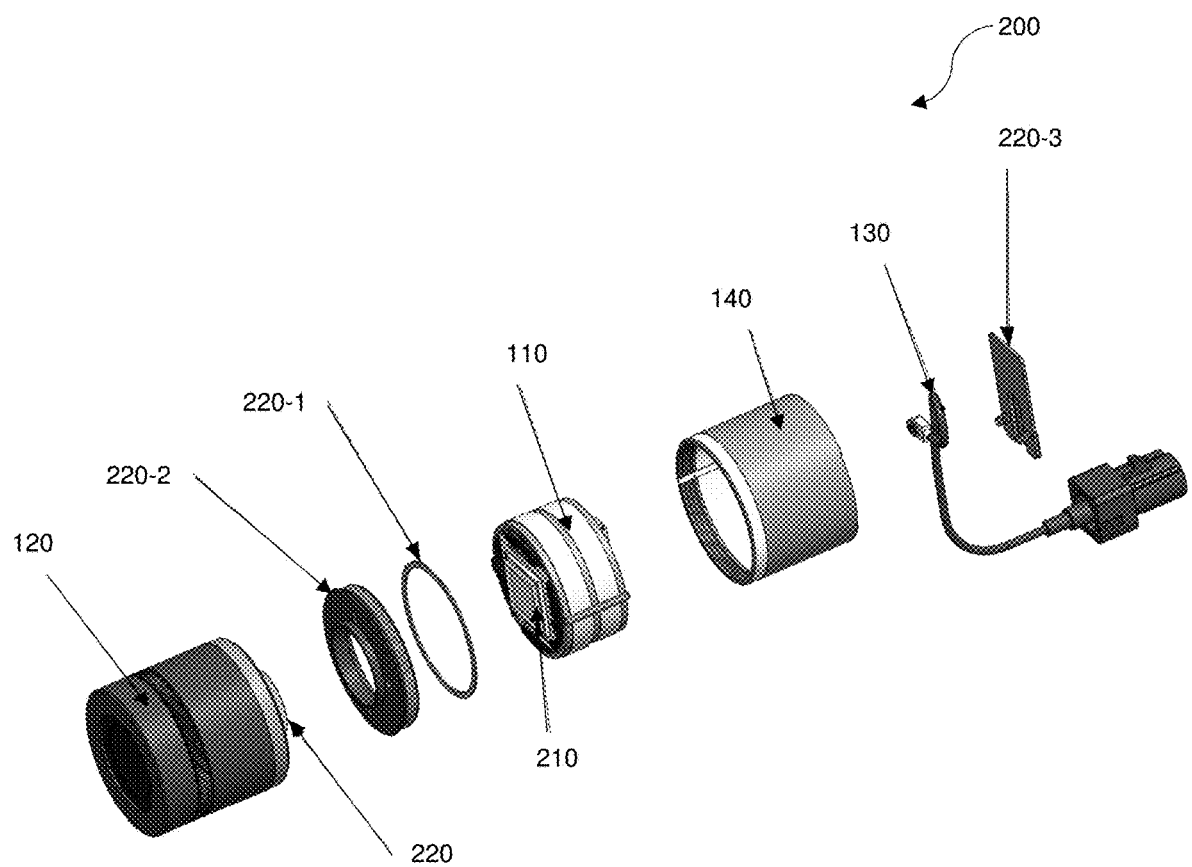
FIG. 2 is an exploded view of a camera apparatus.

FIG. 2 shows an exploded view 200 of the infrared camera apparatus 100. The exploded view 200 illustrates the thermal core 110, the lens 120, the electrical component 130, the housing 140, an infrared imager 210 disposed on the thermal core 110, and connecting members 220-1 through 220-3. In an example implementation, the connecting members 220 include a ring 220-1, a retainer 220-2, and a back cover 220-3.

In an embodiment, the infrared imager 210 is disposed on a substrate (e.g., the substrate 310, FIG. 3) of the thermal core 110 such that the infrared imager 210 is electrically connected to the substrate. The infrared imager 210 may be affixed to the substrate, for example via adhesive between the infrared imager 210 and a die of the substrate. The substrate may be, for example, a printed circuit board (PCB). The die may be a single die or a die stack, and may be or may include an application-specific integrated circuit (ASIC).

Figure 3:
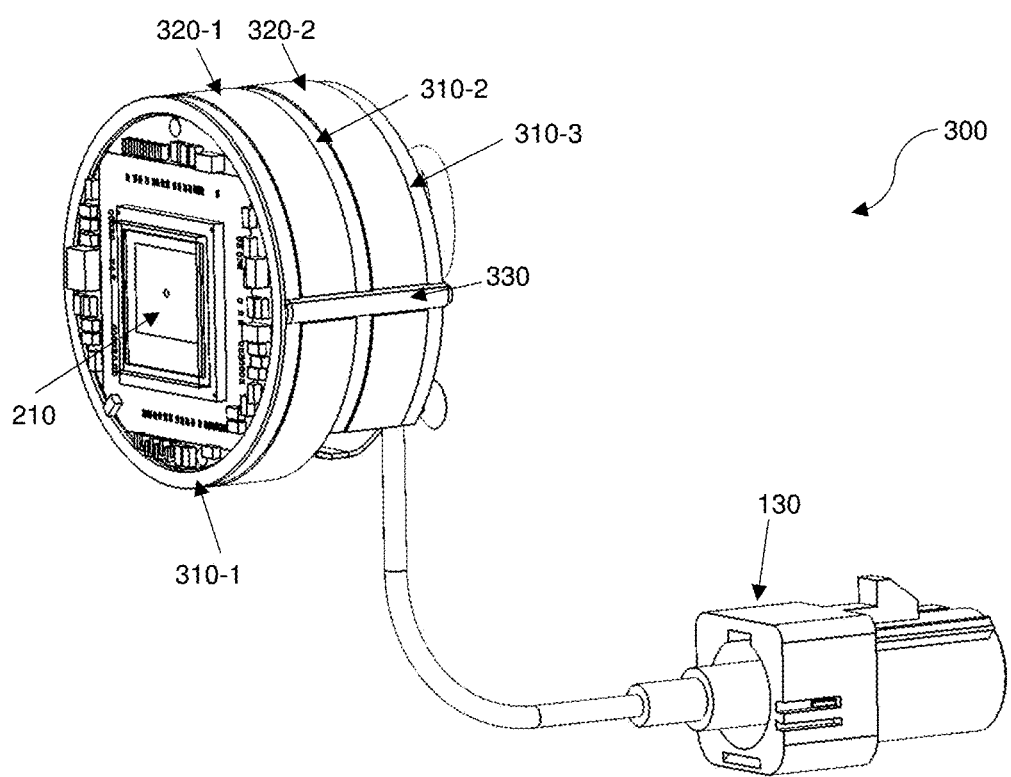
FIG. 3 is an isometric view of a thermal core.

FIG. 3 shows an isometric view 300 of various components of the infrared camera apparatus 100 and, in particular, components of the thermal core 110. In an embodiment, the thermal core 110 includes substrates 310-1 through 310-3, thermally conductive members 320-1 and 320-2, and one or more connection members 330. The substrate 310-1 has disposed thereon the imager 210 which may be affixed to the substrate 310-1 via, e.g., an adhesive. The imager 210 is further wired to the substrate 310 by, e.g., wire bonding. The connection member 330 may be, for example, a locating pin utilized to connect the substrates 310-1 through 310-3 and the thermally conductive members 320-1 and 320-2. Each of the substrates 310-1 through 310-3 may be, for example, a PCB.

In an embodiment, the thermally conductive members 320-1 and 320-2 are configured to remove heat from the thermal core 110 and, particularly, to mitigate heat from the substrates 310-1 through 310-3 that may cause distortions or other reductions in image quality of the imager 210. In the example view shown in FIG. 3, the thermal core 110 includes a first thermally conductive member 320-1 and a second thermally conductive member 320-2. Each of the thermally conductive members 320-1 and 320-2 is made of a thermally conductive material such as, but not limited to, brass, copper, and the like.

In an embodiment, the total surface area of the substrates 310 may be a fixed area. To this end, the number of substrates used may be dependent on the size and, specifically, the surface area, of each substrate. In the example implementation shown in FIG. 3, three substrates 310-1 through 310-3 are used. In other implementations, a lower number of larger substrates or a higher number of smaller substrates may be used.

The thermally conductive members 320-1 and 320-2 are utilized as spacers between the substrates 310-1 and 310-2 as well as between the substrates 310-2 and 310-3, respectively. Accordingly, the thermally conductive member 320-1 allows for heat distribution away from the imager 210 through a back side of the substrate 310-1 and out of the housing 140, FIG. 1. The thermally conductive members 320-1 and 320-2 may be thermally connected to the respective PCBs 310-1 through 310-3 using a thermally conductive material such as, for example, thermal grease, a thermal pad, both, and the like. In an example implementation, the thermally conductive member 320-1 is thermally connected to the substrate 310-1 via thermal grease, while the thermally conductive member 320-2 is thermally connected to the substrates 320-2 and 320-3 via thermal pads.

In some implementations, the substrate 310-1 may have disposed thereon a thermal uniformity member (not shown) such as, but not limited to, a copper coin insert. The thermal uniformity member may be made of thermally conductive material (e.g., copper) such that heat from the substrate 310-1 is not concentrated on a single point on the imager 210. The imager 210 may be affixed to the thermal uniformity member of the substrate 310-1.

It should be noted that two thermally conductive members 320-1 and 320-2 are shown in FIG. 3 merely for example purposes, and that other numbers of thermally conductive members may be equally utilized. Specifically, in an example implementation, if substrates are added or removed, a corresponding conductive member may be added or removed, respectively.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. A camera apparatus, comprising:
   a housing having a front end and a back end;
   a lens, wherein the lens is disposed in the front end of the housing; and
   a thermal core, wherein the thermal core is disposed between the lens and the back end of the housing, the thermal core further comprising:
   at least one substrate, wherein the at least one substrate includes at least a first substrate and a second substrate;
   an electrical component coupled to the at least one substrate, wherein the electrical component is configured to provide power to the thermal core, wherein the electrical component is electrically connected to the second substrate;
   at least one thermally conductive member configured to remove heat from the thermal core, wherein the at least one thermally conductive member is disposed between the first substrate and the second substrate; and
   an infrared imager affixed to one of the at least one substrate, the infrared imager configured to capture an infrared video stream, wherein the infrared imager is disposed on the first substrate.

2. The camera apparatus of claim 1, wherein the at least one substrate is a printed circuit board.

3. The camera apparatus of claim 1, wherein the electrical component comprises at least one of: a coaxial cable and a gigabit multimedia serial link cable.

4. The camera apparatus of claim 1, wherein the camera apparatus is structured as a shutterless camera.

5. The camera apparatus of claim 1, wherein the at least one thermally conductive member is made of at least one of: brass and copper.

6. The camera apparatus of claim 1, wherein the at least one thermally conductive is configured to allow for heat distribution away from the imager through a back side of the substrate and out of the housing.

7. The camera apparatus of claim 1, wherein camera apparatus is integrated in any one of: an advanced driver assistance system and an autonomous vehicle.

8. An advanced driver assistance system, comprising:
   a shutterless far-infrared (FIR) camera integrated in a vehicle, wherein the camera is structured to include:
   a housing having a front end and a back end;
   a lens disposed in the front end of the housing; and a thermal core disposed between the lens and the back end of the housing, the thermal core further comprising:
at least one substrate, wherein the at least one substrate includes at least a first substrate and a second substrate;
at least one electrical component coupled to the at least one substrate, wherein the electrical component is configured to provide power to the thermal core, wherein the electrical component is electrically connected to the second substrate;
at least one thermally conductive member configured to remove heat from the thermal core, wherein the at least one thermally conductive member is disposed between the first substrate and the second substrate; and
an infrared imager affixed to one of the at least one substrate, the infrared imager configured to capture an infrared video stream, wherein the infrared imager is disposed on the first substrate.

9. The advanced driver assistance system of claim 8, wherein the at least one thermally conductive member is configured to allow for heat distribution away from the imager through a back side of the substrate and out of the housing.

10. A vehicle, comprising:
an autonomous vehicle system;
a shutterless far-infrared (FIR) camera integrated the autonomous vehicle system, wherein the camera is structured to include:
a housing having a front end and a back end;
a lens disposed in the front end of the housing; and
a thermal core disposed between the lens and the back end of the housing, the thermal core further comprising:
at least one substrate, wherein the at least one substrate includes at least a first substrate and a second substrate;
at least one electrical component coupled to the at least one substrate, wherein the electrical component is configured to provide power to the thermal core, wherein the electrical component is electrically connected to the second substrate;
at least one thermally conductive member configured to remove heat from the thermal core, wherein the at least one thermally conductive member is disposed between the first substrate and the second substrate; and
an infrared imager affixed to one of the at least one substrate, the infrared imager configured to capture an infrared video stream, wherein the infrared imager is disposed on the first substrate.

11. The vehicle of claim 10, wherein the at least one thermally conductive member is configured to allow for heat distribution away from the imager through a back side of the substrate and out of the housing.

* * * * *